(12) United States Patent
Fujii et al.

(10) Patent No.: US 7,809,032 B2
(45) Date of Patent: *Oct. 5, 2010

(54) CONTROL METHOD OF DISTRIBUTED BRAGG REFLECTION SEMICONDUCTOR LASER, AND IMAGE PROJECTING APPARATUS

(75) Inventors: Kazunari Fujii, Kanagawa-ken (JP); Hajime Sakata, Shizuoka-ken (JP); Yukio Furukawa, Kanagawa-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 1 day.

This patent is subject to a terminal disclaimer.

(21) Appl. No.: 12/363,708

(22) Filed: Jan. 30, 2009

(65) Prior Publication Data

US 2009/0213886 A1    Aug. 27, 2009

Related U.S. Application Data

(62) Division of application No. 11/896,142, filed on Aug. 30, 2007, now Pat. No. 7,512,160, which is a division of application No. 11/120,951, filed on May 4, 2005, now Pat. No. 7,313,156.

(30) Foreign Application Priority Data

May 12, 2004  (JP) .............................. 2004-142955
Mar. 1, 2005  (JP) .............................. 2005-055237

(51) Int. Cl.
   *H01S 3/13*     (2006.01)
   *H01S 5/00*     (2006.01)
(52) U.S. Cl. ................................ 372/29.016; 372/50.11

(58) Field of Classification Search ............. 372/29.016, 372/29.023, 50.11, 96, 38.07
See application file for complete search history.

(56) References Cited

U.S. PATENT DOCUMENTS

| 5,606,447 | A    | 2/1997  | Asada et al. |
| 7,411,992 | B2 * | 8/2008  | Furukawa et al. ............. 372/96 |
| 7,512,160 | B2 * | 3/2009  | Fujii et al. ..................... 372/21 |
| 2001/0050932 | A1 | 12/2001 | Sonoda et al. |
| 2003/0219046 | A1 | 11/2003 | Kitaoka et al. |

FOREIGN PATENT DOCUMENTS

| JP | 02-722314  | 3/1998 |
| JP | 2002-43683 | 2/2002 |

* cited by examiner

*Primary Examiner*—Armando Rodriguez
(74) *Attorney, Agent, or Firm*—Fitzpatrick, Cella, Harper & Scinto

(57) ABSTRACT

A DBR semiconductor laser is controlled in an image projecting apparatus, which includes the DBR laser having a phase and DBR region, a light wavelength converting device for converting fundamental-wave light emitted from the DBR laser into second harmonic wave light, an optical deflector for scanning the second harmonic wave in a one or two-dimensional manner, and a modulating portion for modulating the DBR laser. Coefficient calculating and wavelength adjusting steps are performed within a non-drawing time. The coefficient calculating step calculates at least one coefficient in a relationship between a DBR current to be injected into the DBR region and a phase current to be injected into the phase region for continuously shifting the wavelength of the fundamental-wave light. The wavelength adjusting step changes DBR current injected into the DBR region and phase current injected into the phase region based on the relationship.

4 Claims, 15 Drawing Sheets

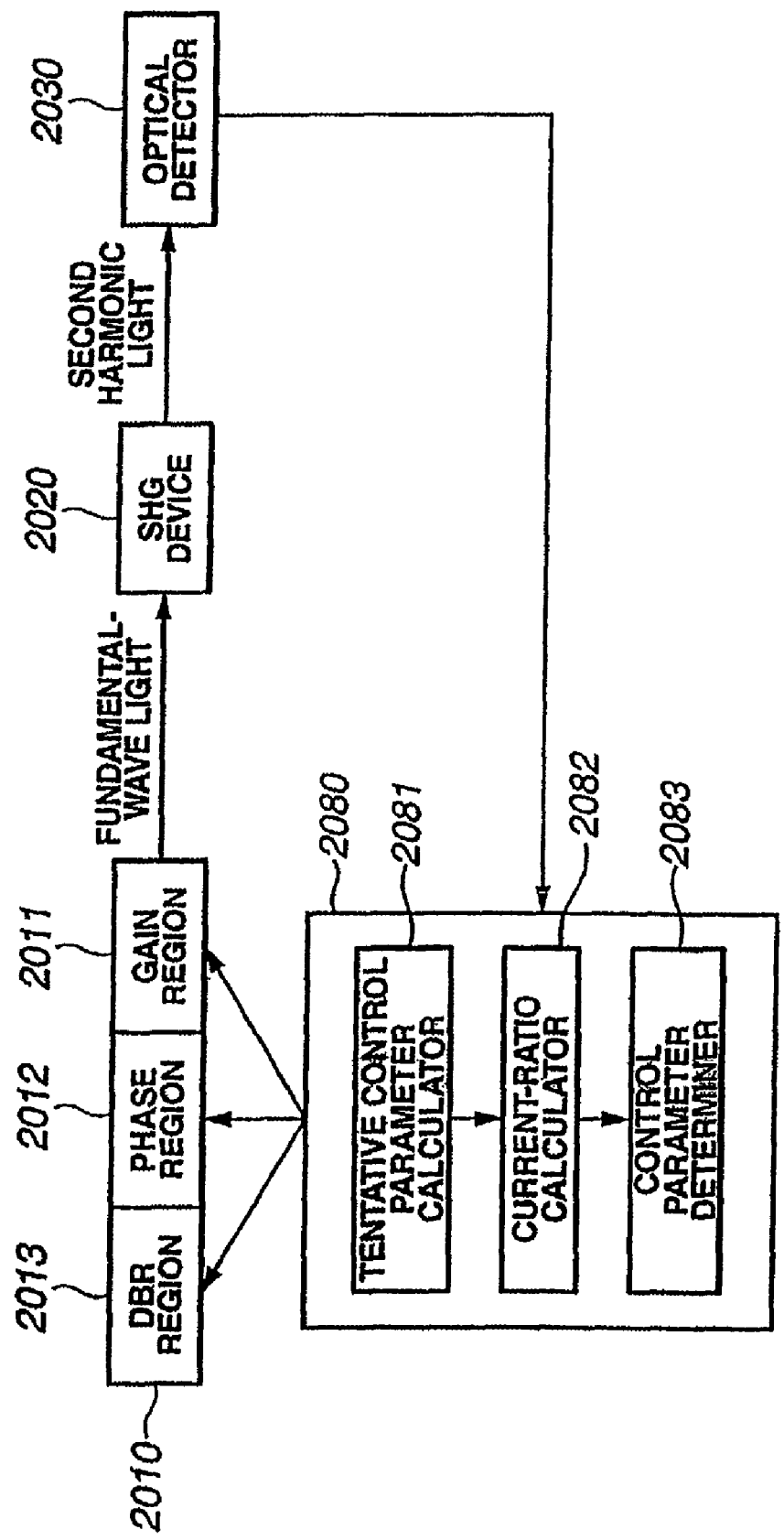

CONTROL METHOD OF DISTRIBUTED BRAGG REFLECTION SEMICONDUCTOR LASER, AND IMAGE PROJECTING APPARATUS

This application is a divisional of application Ser. No. 11/896,142, now allowed, filed Aug. 30, 2007, which is a divisional of application Ser. No. 11/120,951, filed May 4, 2005, now U.S. Pat. No. 7,313,156. The contents of each of these applications are incorporated herein by reference.

BACKGROUND OF THE INVENTION

1. Field of the Invention

The present invention relates to an image projecting apparatus, such as an image displaying apparatus (e.g., a laser display) and an image forming apparatus (e.g., a laser beam printer), including a light wavelength converting apparatus for converting light of a semiconductor laser or a laser diode (LD) into second harmonic wave light, a method of controlling a distributed Bragg reflection (DBR) semiconductor laser, and the like.

2. Description of the Related Background Art

In the past, there have been proposed a variety of image projecting apparatuses which use as a light source a semiconductor light emitting device which is capable of being directly modulated, such as a laser diode or a light emitting diode (LED), and a micro mirror acting as an optical deflector. By using such a direct-modulation semiconductor light emitting device, it is possible to reduce the cost and the size of the image projecting apparatus, as compared with an image projecting apparatus using a gas laser or the like that needs an electro-optic modulator or an acousto-optic modulator.

In connection with an optical deflector, Japanese Patent No. 2722314 discloses a super-micro optical deflector with a mirror of several square millimeters, that is achieved by processing a silicon of semiconductor material using "micromechanics" technology. This micro-mirror is of an electromagnetic type, in which a driving current is caused to flow in a planar coil, and the mirror is driven by a Lorentz force acting between a permanent magnet and the planar coil. Further, a large number of micro-mirrors of an electrostatic type and a piezoelectric type have been proposed. A small-sized image projecting apparatus capable of reducing power consumption can be obtained by using the semiconductor light emitting device and the micro-mirror.

Further, there has been in the past proposed an apparatus, in which fundamental-wave light emitted from a distributed Bragg reflection (DBR) semiconductor laser is input into a light wavelength converting device to generate second harmonic wave light, and a short-wavelength coherent light is thus obtained. When the short-wavelength coherent light is used for an optical disc, a face-recording density on the disc can be increased since the size of a light spot on the disc can be reduced.

Furthermore, Japanese Patent Application Laid-Open No. 2002-43683 discloses an apparatus and a method of calculating a control parameter for a distributed Bragg reflection (DBR) semiconductor laser.

FIG. 16 illustrates an apparatus that calculates a control parameter for a DBR semiconductor laser. As illustrated in FIG. 16, the apparatus includes a DBR semiconductor laser 2010, a second harmonic generation (SHG) device 2020, an optical detector 2030, and a control portion 2080. The DBR semiconductor laser 2010 is comprised of a gain region 2011, a phase region 2012 and a DBR region 2013 with a diffraction grating. The control portion 2080 includes a tentative-control-parameter calculator 2081, a current-ratio calculator 2082, and a control parameter determiner 2083.

In the apparatus, fundamental-wave light is input into the SHG device 2020. The SHG device 2020 converts the wavelength of the fundamental-wave light, and outputs second harmonic wave light. The second harmonic wave light is input into the optical detector 2030. The optical detector 2030 converts the second harmonic wave light into an electrical signal. The control portion 2080 monitors the electrical signal from the optical detector 2030 while changing a phase current injected into the phase region 2012 and a DBR current injected into the DBR region 2013. The control portion 2080 thereby acquires changing points of output power of the second harmonic wave light occurring due to a mode hop of the semiconductor laser 2010. From the changing points, the control portion 2080 extracts a control parameter for controlling the phase current and the DBR current such that a high power second harmonic wave light can be obtained without occurrence of any mode hop. The DBR semiconductor laser 2010 is driven pursuant to the control parameter.

However, problems arise when second harmonic wave light generated by converting the wavelength of fundamental-wave light from the above-discussed DBR semiconductor laser with a light wavelength converting device is used in an image projecting apparatus. These problems include the appearance of chromatic unevenness of an image when the semiconductor laser is controlled in a drawing area of the image projecting apparatus, the shifting of a wavelength of the fundamental-wave light if an atmospheric temperature changes, and the shifting of a wavelength range of a high output of the light wavelength converting device if the atmospheric temperature changes. Accordingly, it becomes difficult to stabilize the second harmonic wave light in the drawing area.

SUMMARY OF THE INVENTION

It is an object of the present invention to provide techniques for improving an image projecting apparatus and a method of controlling a distributed Bragg reflection (DBR) semiconductor laser.

According to one aspect of the present invention, there is provided a control method of controlling a distributed Bragg reflection (DBR) semiconductor laser in an image projecting apparatus, the image apparatus including the DBR semiconductor laser which is provided with a phase region and a DBR region, a light wavelength converting device for converting fundamental-wave light emitted from the DBR semiconductor laser into second harmonic wave light, an optical deflector for scanning the second harmonic wave light in a one-dimensional or two-dimensional manner, and a modulating portion for modulating the DBR semiconductor laser based on an image signal.

In the control method, a coefficient calculating step and a wavelength adjusting step are performed within a non-drawing time during which a drawing signal, which corresponds to the image signal, is absent. In the coefficient calculating step, at least one coefficient in a relationship between a DBR current to be injected into the DBR region and a phase current to be injected into the phase region for continuously shifting the wavelength of the fundamental-wave light is calculated. In the wavelength adjusting step, the DBR current injected into the DBR region and the phase current injected into the phase region are changed based on the relationship such that the second harmonic wave light is adjusted.

In the above control method, it is possible to perform an output adjusting step in the non-drawing time to additionally carry out an APC (auto power control) function. In the output adjusting step, while the current injected into the DBR semiconductor laser is controlled, the second harmonic wave light is adjusted at a desired value, using a monitoring result of a detector for monitoring the amount of the second harmonic wave light, or the amounts of the fundamental-wave light and the second harmonic wave light.

Further, it is possible to correct the at least one coefficient in the relationship in the coefficient calculating step, pursuant to a gain current injected into a gain region of the DBR semiconductor laser, and to additionally carry out a function of correcting the relationship in accordance with the active current injected into the active region.

Moreover, it is possible to provide a temperature monitor for monitoring temperature of the DBR semiconductor laser, and to carry out a temperature adjusting step in the non-drawing time. In the temperature adjusting step, the at least one coefficient in the relationship in the coefficient calculating step is corrected pursuant to temperature information from the temperature monitor, and a function of correcting the relationship in accordance with the temperature is additionally carried out. Such a control can be achieved by implementing a program for executing its procedure in the control portion for controlling the current to be injected into the semiconductor laser, for example.

According to another aspect of the present invention, there is provided an image projecting apparatus which includes a distributed Bragg reflection (DBR) semiconductor laser provided with a phase region and a DBR region, a light wavelength converting device for converting fundamental-wave light emitted from the DBR semiconductor laser into second harmonic wave light, an optical deflector for scanning the second harmonic wave light in a one-dimensional or two-dimensional manner, and a modulating portion for modulating the DBR semiconductor laser based on an image signal, a coefficient calculating portion, and a wavelength adjusting portion.

The coefficient calculating portion calculates at least one coefficient in a relationship between a DBR current to be injected into the DBR region and a phase current to be injected into the phase region for continuously shifting the wavelength of the fundamental-wave light, within a non-drawing time during which a drawing signal, which corresponds to the image signal, is absent. The wavelength adjusting portion changes the DBR current injected into the DBR region and the phase current injected into the phase region, based on the relationship, such that the second harmonic wave light is adjusted, within the non-drawing time.

According to still another aspect of the present invention, there is provided an image projecting apparatus which includes a distributed Bragg reflection (DBR) semiconductor laser provided with a phase region and a DBR region, a light wavelength converting device for converting fundamental-wave light emitted from the DBR semiconductor laser into second harmonic wave light, a detector for monitoring the amount of the second harmonic wave light, or the amounts of the fundamental-wave light and the second harmonic wave light, an optical deflector for scanning the second harmonic wave light in a one-dimensional or two-dimensional manner, a modulating portion for modulating the DBR semiconductor laser based on an image signal, a coefficient calculating portion, and a wavelength adjusting portion.

The coefficient calculating portion calculates at least one coefficient in a relationship between a DBR current to be injected into the DBR region and a phase current to be injected into the phase region for continuously shifting the wavelength of the fundamental-wave light from the DFB semiconductor laser, using a monitoring result of the detector, within a non-drawing time during which a drawing signal, corresponding to the image signal, is absent. The wavelength adjusting portion adjusts the wavelength of the fundamental-wave light such that the second harmonic wave light or an efficiency of the second harmonic wave light relative to the fundamental-wave light comes close to its peak, based on the relationship, using the monitoring result of the detector, within the non-drawing time.

According to the present invention, at least one coefficient in the relationship between the DBR current to be injected into the DBR region and the phase current to be injected into the phase region for continuously shifting the wavelength of the fundamental-wave light is calculated in the non-drawing time, and the DBR current injected into the DBR region and the phase current injected into the phase region are changed based on the relationship such that the second harmonic wave light is adjusted, in the non-drawing time of an image projecting apparatus. Therefore, the second harmonic wave light can be stabilized in a drawing area of the image projecting apparatus.

These advantages, as well as others, will be more readily understood in connection with the following detailed description of the preferred embodiments and examples of the invention in connection with the drawings.

BRIEF DESCRIPTION OF THE DRAWINGS

FIG. 16 is a block diagram illustrating the structure of a conventional apparatus for calculating a control parameter.

DETAILED DESCRIPTION OF THE PREFERRED EMBODIMENTS

Embodiments of the present invention will hereinafter be described with reference to the drawings.

Figure 1:
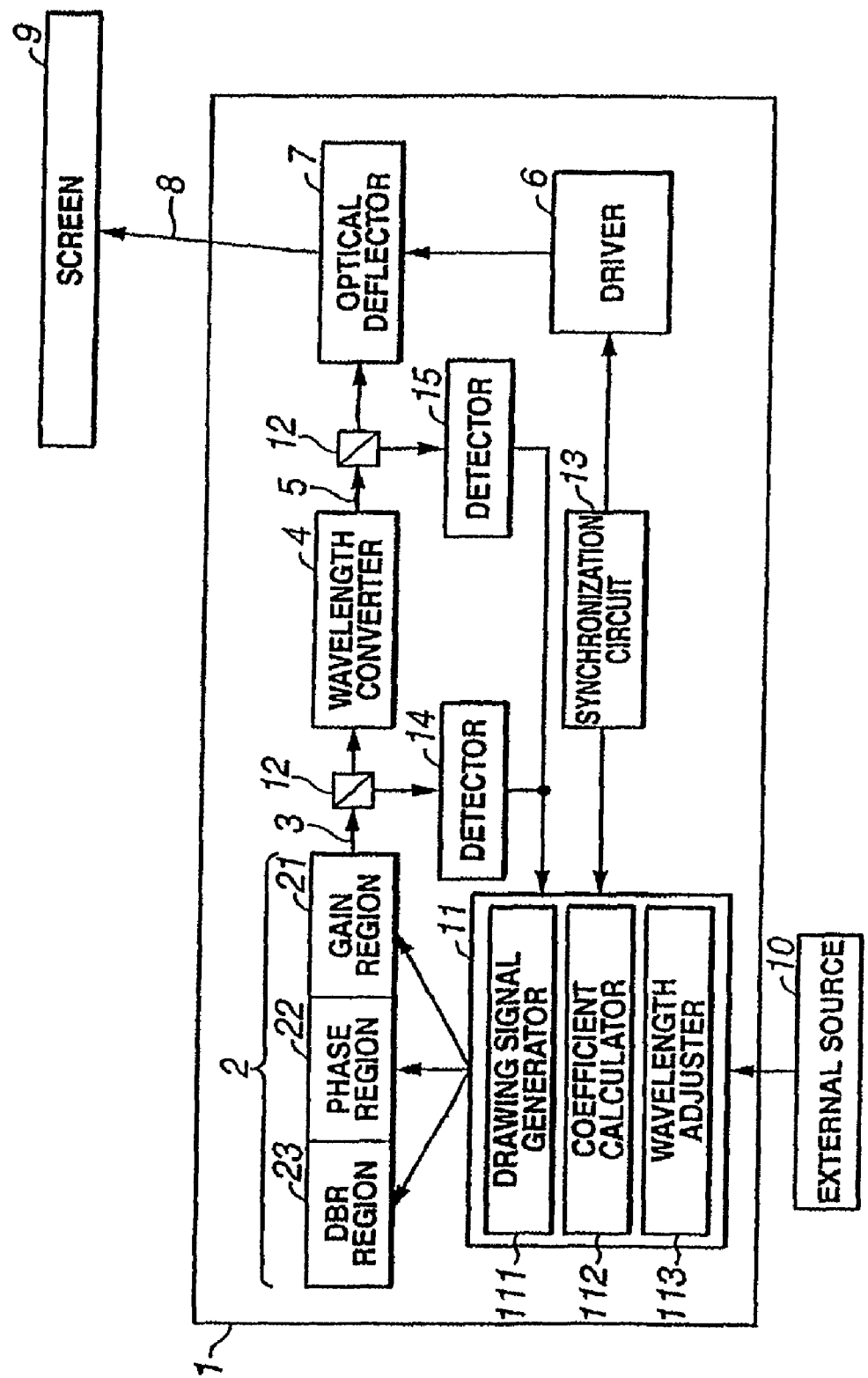
FIG. 1 is a block diagram illustrating the structure of an embodiment of an image projecting apparatus according to the present invention.

FIG. 1 illustrates the structure of an embodiment of an image projecting apparatus 1 according to the present invention. As illustrated in FIG. 1, a DBR semiconductor laser 2 includes a gain region 21, a phase region 22, and a DBR region 23 provided with a diffraction grating. The DBR semiconductor laser 2 emits fundamental-wave light 3. The fundamental-wave light 3 is input into a light wavelength converting device 4. The light wavelength converting device 4 converts the fundamental-wave light 3 into its second harmonic wave light 5. The second harmonic wave light 5 is deflected by an optical deflector 7 driven by a deflector driver 6. Deflected light 8 forms an image on a projection surface or a screen 9.

A drawing signal is generated pursuant to an image signal from an external source 10 by a drawing signal generator 111 in a control portion 11. A current injected into at least one of the active region 21, the DBR region 23 and the phase region 22 is changed in accordance with the drawing signal to modulate the fundamental-wave light 3

A portion of the fundamental-wave light 3 is separated by a beam splitter 12, and its amount is detected by a fundamental wave detector 14. A portion of the second harmonic wave light 5 is separated by another beam splitter 12, and its amount is detected by a second harmonic wave light detector 15. A filter (not shown) for cutting the fundamental-wave light is provided between the second harmonic wave light detector 15 and the light wavelength converting device 4.

Further, based on the amounts of the fundamental-wave light 3 and the second harmonic wave light 5, a coefficient calculator 112 in the control portion 11 calculates a coefficient or coefficients in a relationship between the DBR current to be injected into the DBR region 23 and the phase current to be injected into the phase region 22, for continuously shifting the wavelength of the fundamental-wave light 3 from the DBR semiconductor laser 2. A wavelength adjuster 113 in the control portion 11 controls those currents based on the above relationship to adjust the wavelength of fundamental-wave light 3 such that an output efficiency of the second harmonic wave light 5 comes close to its peak.

The control portion 11 and the deflector driver 6 are synchronized with each other by a synchronization circuit 13. The coefficient calculator 112 calculates the coefficient or coefficients in the relationship between the DBR and phase currents within a non-drawing time during which the image signal is absent, and the wavelength adjuster 113 adjusts the wavelength of fundamental-wave light 3 such that the output efficiency of the second harmonic wave light 5 comes close to its peak, in the non-drawing time. According to the above-discussed operation, the amount of the second harmonic wave light 5 is stabilized in a drawing time during which the image signal is present, and the drawing light 8 forms a preferable image on the projection surface 9.

More specific embodiments will now be described.

Figure 2:
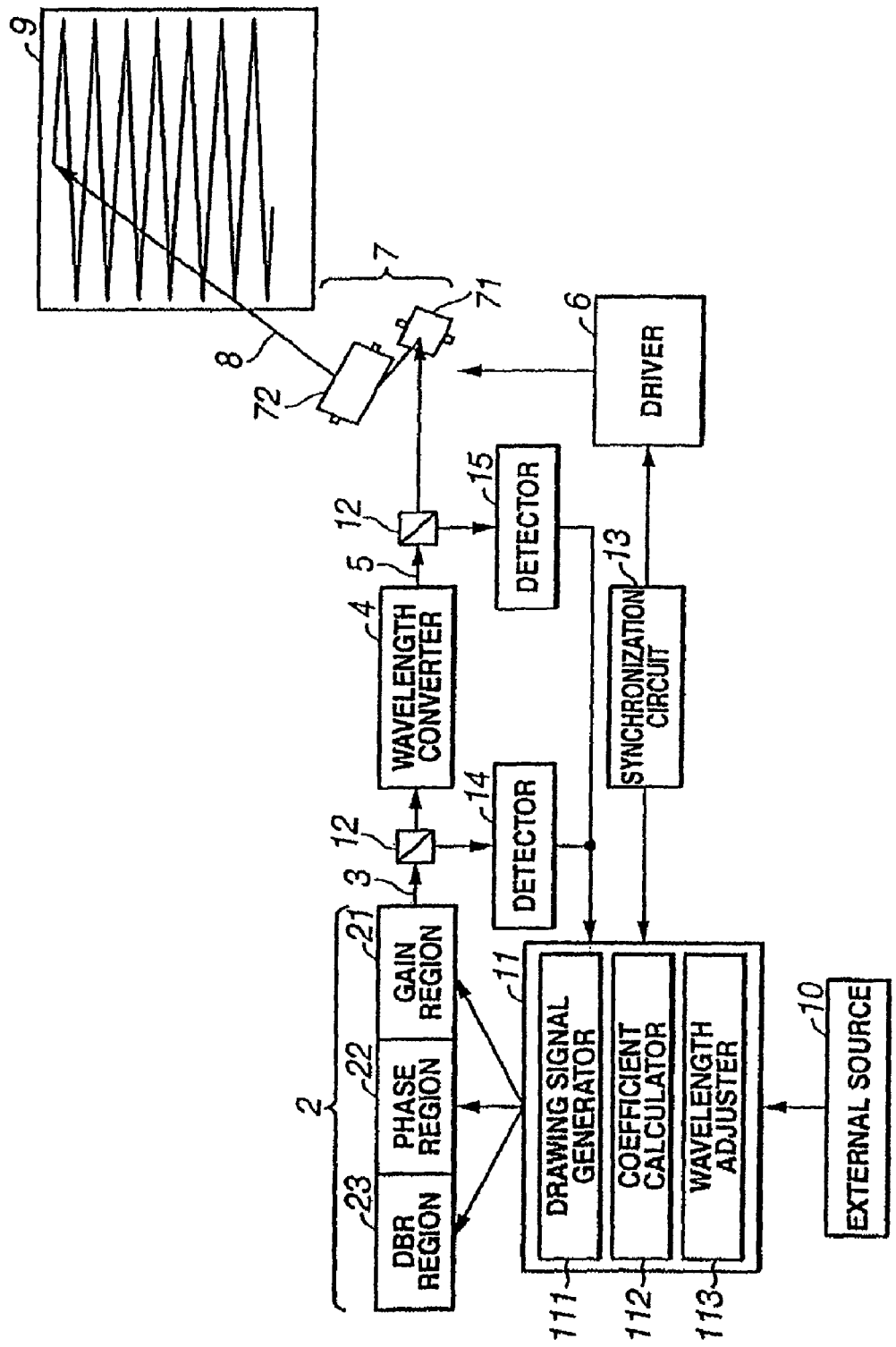
FIG. 2 is a view schematically illustrating the structure of a first embodiment of an image displaying apparatus according to the present invention.

FIG. 2 illustrates a first embodiment of an image displaying apparatus. In FIG. 2, the same portions or elements as those in FIG. 1 are designated by the same reference numerals.

In the first embodiment, a phase region 22 and a DBR region 23 in a DFB semiconductor laser 2 are constructed such that temperature thereof can be controlled by injecting current into a thin-film heater. The wavelength of fundamental-wave light 3 is changed by such a change in the temperature. In the first embodiment, the fundamental-wave light 3 is infrared light at a wavelength of about 1060 nm, and second harmonic wave light 8 is green light at a wavelength of about 530 nm.

Figure 3A:
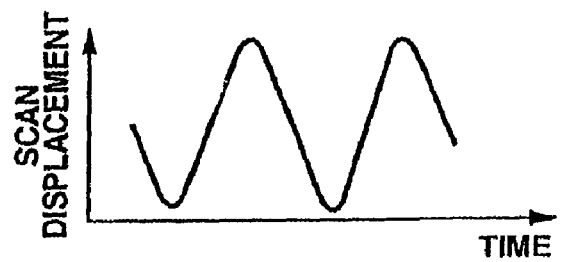
FIG. 3A is a graph showing a relationship between a scan displacement and time of a main-direction optical deflector in the first embodiment.
Figure 3B:
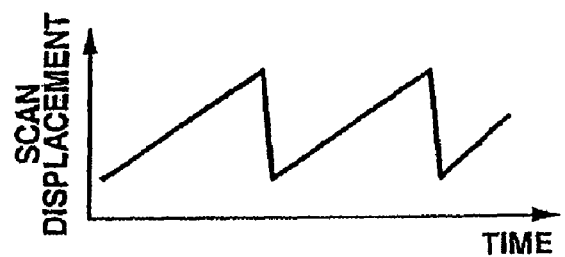
FIG. 3B is a graph showing a relationship between a scan displacement and time of an auxiliary-direction optical deflector in the first embodiment.

An optical deflector 7 is comprised of a main-direction optical deflector 71 and an auxiliary-direction optical deflector 72, and deflects the second harmonic wave light 5 in a two-dimensional manner. The main-direction optical deflector 71 includes a mirror, which is supported by a pair of torsion bars, and undergoes a sinusoidal-wave drive (its driving frequency is about 20 kHz) as illustrated in FIG. 3A, owing to a rotational reciprocal oscillation of the mirror about an axis defined by the torsion bars, for example. The main-direction optical deflector 71 used here can be replaced by a polygon mirror or the like. The auxiliary-direction optical deflector 72 includes a mirror mounted to an axis of a stepping motor, and undergoes a sawtooth-wave drive (its driving frequency is about 60 Hz) as illustrated in FIG. 3B, for example. The auxiliary-direction optical deflector 72 can be similarly replaced by a polygon mirror or the like.

Figure 4:
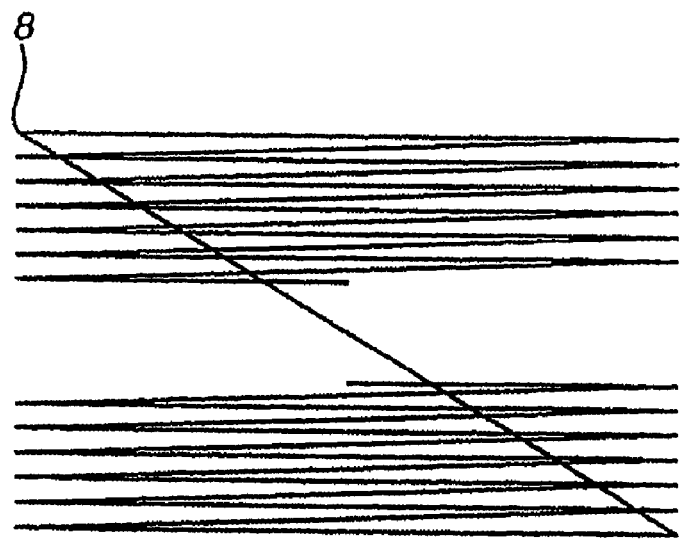
FIG. 4 is a view illustrating a locus of drawing light on a projection surface.
Figure 5:
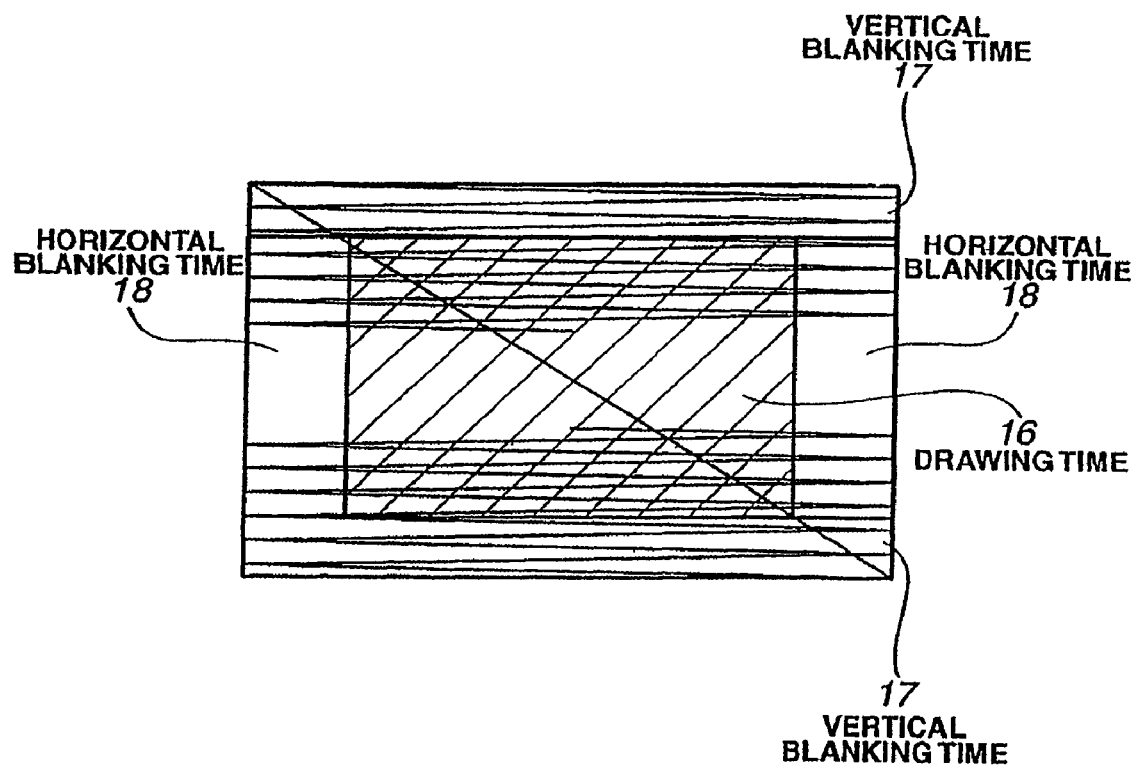
FIG. 5 is a view showing a relationship between a drawing area, a horizontal blanking and a vertical blanking on a projection surface.

The drawing light 8 deflected by the optical deflector 7 traces a locus as illustrated in FIG. 4, and an image is accordingly formed on the projection surface 9. Here, in connection with the locus of the drawing light 8 illustrated in FIG. 4, a drawing time 16, a vertical blanking time 17 and a horizontal blanking time 18 illustrated in FIG. 5 are defined as follows. The drawing time 16 is a period during which a signal from an external source 10 executes drawing in a drawing area on a projection surface 9. The vertical blanking time 17 is a period during which the deflected light is present in uppermost and lowermost horizontal zones in the non-drawing area. The horizontal blanking time 18 is a period during which the deflected light is present in rightmost and leftmost vertical zones in the non-drawing area.

Figure 6:
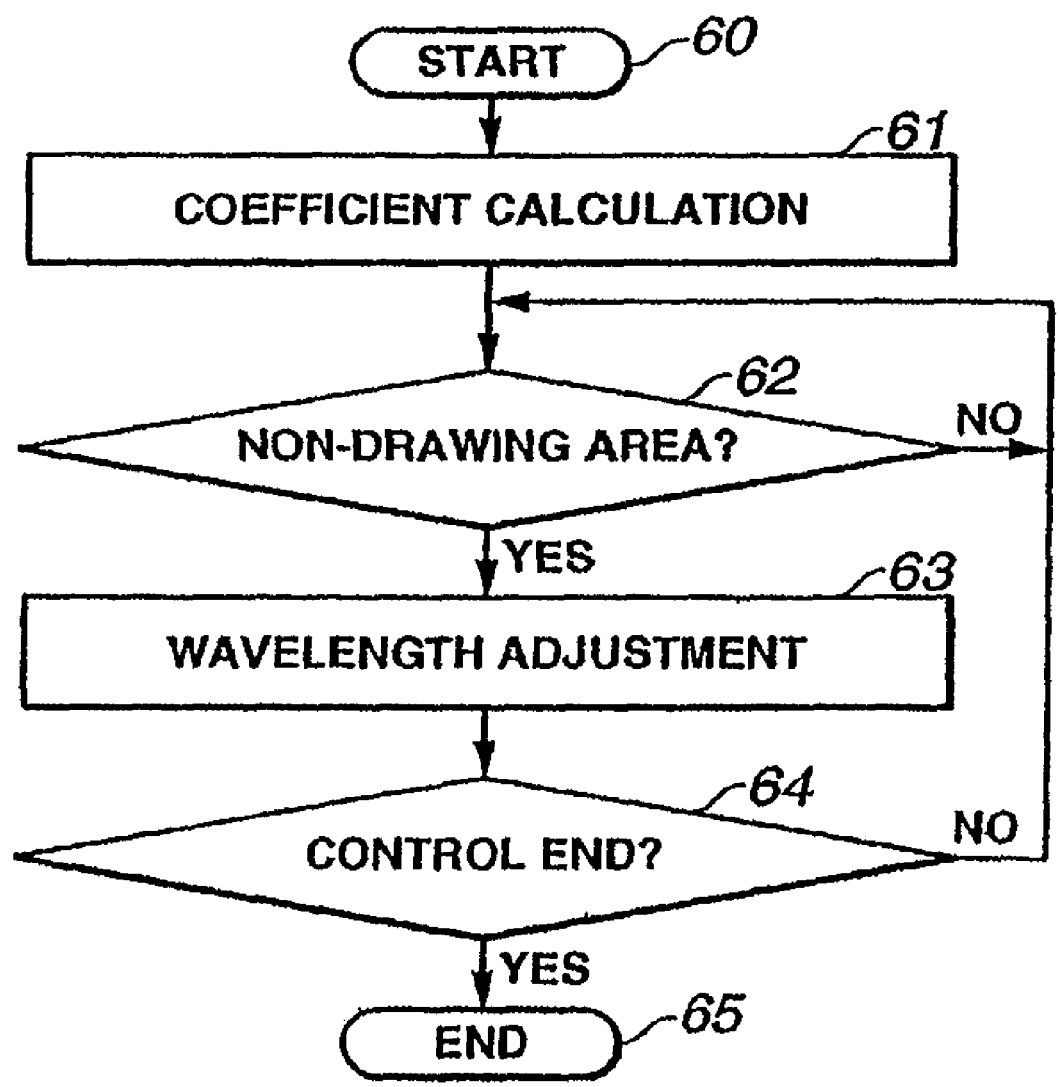
FIG. 6 is a control flow chart of the first embodiment.

FIG. 6 shows a control flow for stabilizing the amount of the second harmonic wave light 5 in the drawing time 16. In the control flow, a coefficient calculation step 61 is initially executed by a coefficient calculator 112 at a starting time of the image projecting apparatus. A wavelength adjustment step 63 is then carried out by a wavelength adjuster 113, based on a non-drawing area decision step 62, in the non-drawing areas corresponding to the vertical blanking time 17 and the horizontal blanking time 18. This is followed by a central end decision step 64 of whether central flow should end. The coefficient calculation step 61 and the wavelength adjustment step 63 will hereinafter be described in detail.

Figure 7:
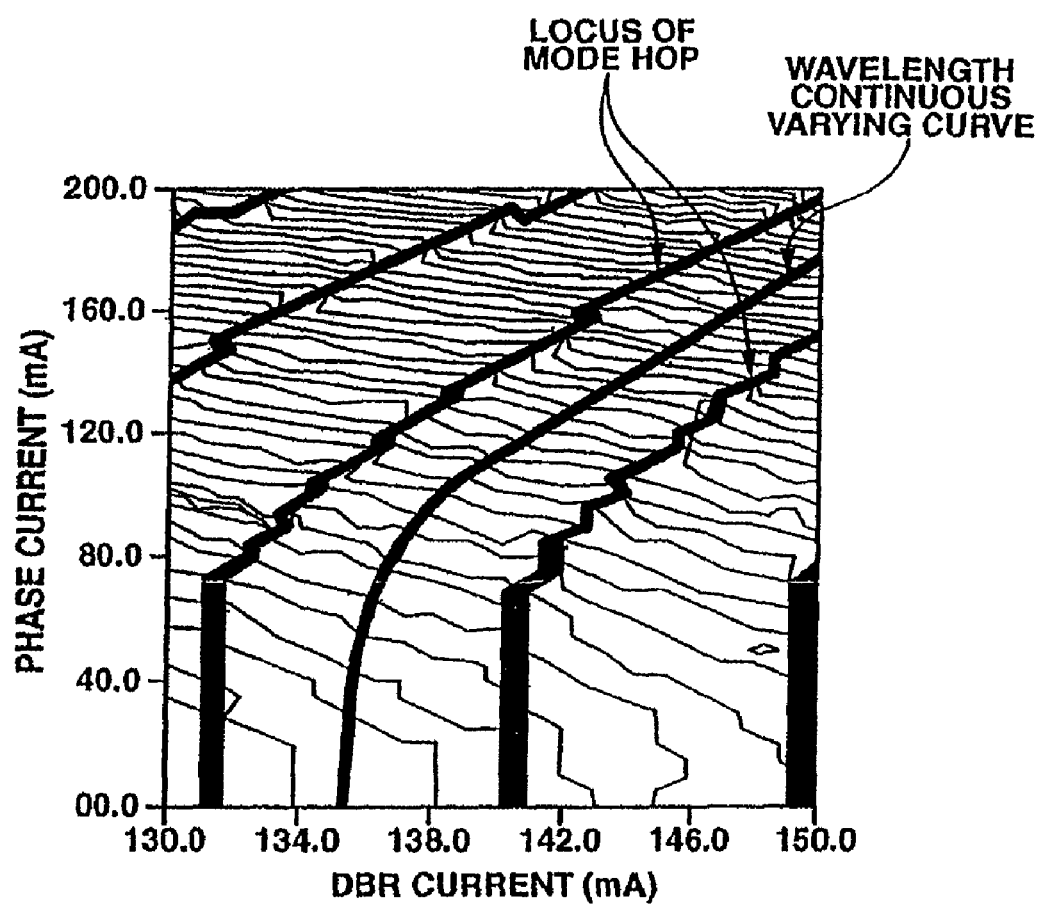
FIG. 7 is a graph showing a relationship between a DBR current, a phase current and an oscillation wavelength of a semiconductor laser in the first embodiment.

The coefficient calculation step 61 will be discussed first. FIG. 7 shows the relationship between DBR current, phase current and oscillation wavelength of the fundamental-wave light 3 from the DFB semiconductor laser 2. Along an abscissa of the graph, the DBR current is graduated in 4.0 in mA increments in a range from 130.0 mA to 150.0 mA. Along an ordinate of the graph, the phase current is graduated in 40.0 mA increments in a range from 0 mA to 200.0 mA. The wavelength varies from 1063.40 nm to 1064.00 nm along a wavelength continuous varying curve. In the graph of FIG. 7, a line extending from an upper left side to a lower right side is an equi-wavelength line, and the wavelength continuously increases from a lower left side to an upper right side except in locus portions of a mode hop.

When currents injected into the phase region 22 and the DBR region 23 are changed, a point, at which a mode hop occurs and the wavelength largely varies, appears. Further, there is between loci of a mode hop the wavelength continuous varying curve, along which the wavelength can be continuously changed when currents injected into the phase region 22 and the DBR region 23 are changed. In the coefficient calculation step 61, changing points of the wavelength due to the mode hop are detected, and a relationship between currents for achieving a continuous change in the wavelength is calculated.

In the DBR semiconductor laser 2 using the thin-film heater, an increase in temperature due to current injected into the heater is proportional to the square of the current, and a change in the refractive index of semiconductor (i.e., a change in the phase) is proportional to a change in the temperature. Accordingly, the wavelength continuous changing curve can be approximately represented by $$A \cdot I_{DBR}^2 + B \cdot I_{phase}^2 = C \quad (1)$$

where $I_{DBR}$ is the DBR current, $I_{phase}$ is the phase current, A and B are proportional coefficients, respectively, and C is a constant.

The determination of the wavelength continuous varying curve is not limited to the above discussion. For example, it can also be carried out by fitting to an appropriate function from discretely-detected points. The proportional coefficients A and B, and the constant C in the formula (1) can be calculated from the DBR current and the phase current which cause the mode hop. Two calculation methods of calculating the proportional coefficients A and B and the constant C of the wavelength continuous varying curve will hereinafter be described.

Figure 8A:
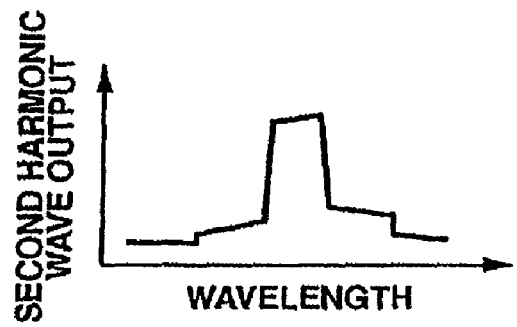
FIG. 8A is a graph showing a relationship between an output of second harmonic wave and an oscillation wavelength of a semiconductor laser.

The first method is as follows. As illustrated in FIG. 7, the wavelength of the fundamental-wave light 3 largely changes when the mode hop appears. Because of the mode hop accompanied with the change in the wavelength, the second harmonic wave light 5 generated by the conversion of the light wavelength converting device 4 is largely changed as illustrated in FIG. 8A. In a graph of FIG. 8A, the phase current is fixed, and the DBR current is changed. It is possible to detect the DBR current and the phase current for causing the mode hop when the change in the amount of the second harmonic wave light 5 is detected by the second harmonic wave light detector 15. A wavelength continuous varying point is set at a central portion between two points of the mode hop detected as discussed above. The proportional coefficients A and B, and the constant C of the wavelength continuous varying curve are calculated by measuring several wavelength continuous varying points.

Figure 8B:
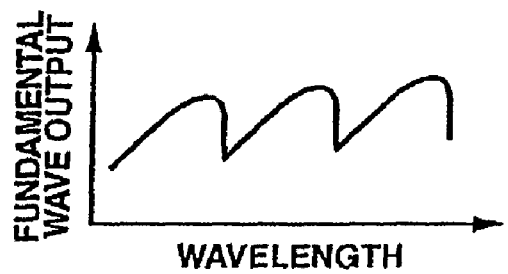
FIG. 8B is a graph showing a relationship between an output of fundamental-wave light and an oscillation wavelength of a semiconductor laser.

The second method of calculating A, B and C is as follows. As illustrated in FIG. 8B, the output of the fundamental-wave light 3 largely changes at a point at which the mode hop appears. It is possible to detect the DBR current and the phase current which cause the mode hop, when the change in the above output is detected by the fundamental wave detector 14. A wavelength continuous varying point is set at a central portion between two points of the mode hop detected as discussed above. The proportional coefficients A and B, and the constant C of the wavelength continuous varying curve are calculated by measuring several wavelength continuous varying points.

As discussed above, at least one of the fundamental-wave light 3 and the second harmonic wave light 5 are monitored by the fundamental wave detector 14 or the second harmonic wave light detector 15. Thus, it is possible to detect the DBR current and the phase current, at which the mode hop is caused, and to calculate the proportional coefficients A and B, and the constant C of the wavelength continuous varying curve.

Figure 8C:
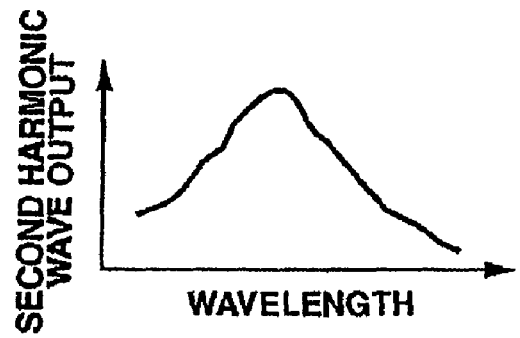
FIG. 8C is a graph showing a relationship between an output of second harmonic wave light and an oscillation wavelength of a semiconductor laser at a time when the oscillation wavelength is continuously changed.

The wavelength adjustment step 63 will now be discussed. When the DBR current and the phase current are controlled along the wavelength continuous varying curve calculated in the coefficient calculation step 61, the wavelength of the fundamental-wave light 3 can be varied without occurrence of any mode hop. FIG. 8C shows a relationship between the wavelength of the fundamental-wave light 3 and the second harmonic wave light 5. In the wavelength adjustment step 63, the DBR current and the phase current are controlled along the wavelength continuous varying curve to sweep the wavelength of the fundamental-wave light 3 as illustrated in FIG. 8C.

During this sweep time, only the second harmonic wave light 5 or both of the fundamental-wave light 3 and the second harmonic wave light 5 (i.e., at least the second harmonic wave light 5) are detected by the fundamental wave detector 14 or the second harmonic wave light detector 15, and the wavelength of the fundamental-wave light 3 is approximately locked at a value at which the second harmonic wave light 5 or its efficiency (a ratio of the output of the second harmonic wave light 5 relative to the output of the fundamental-wave light 3) reaches its peak.

According to the first embodiment, in the DBR semiconductor laser 2 using the thin-film heater, it is possible to fix the second harmonic wave light 5 or its efficiency in the drawing area approximately at its peak. Accordingly, the amount of the second harmonic wave light 5 can be stabilized in the drawing time, and the drawing light 8 can form a preferable image on the projection surface 9.

Figure 9:
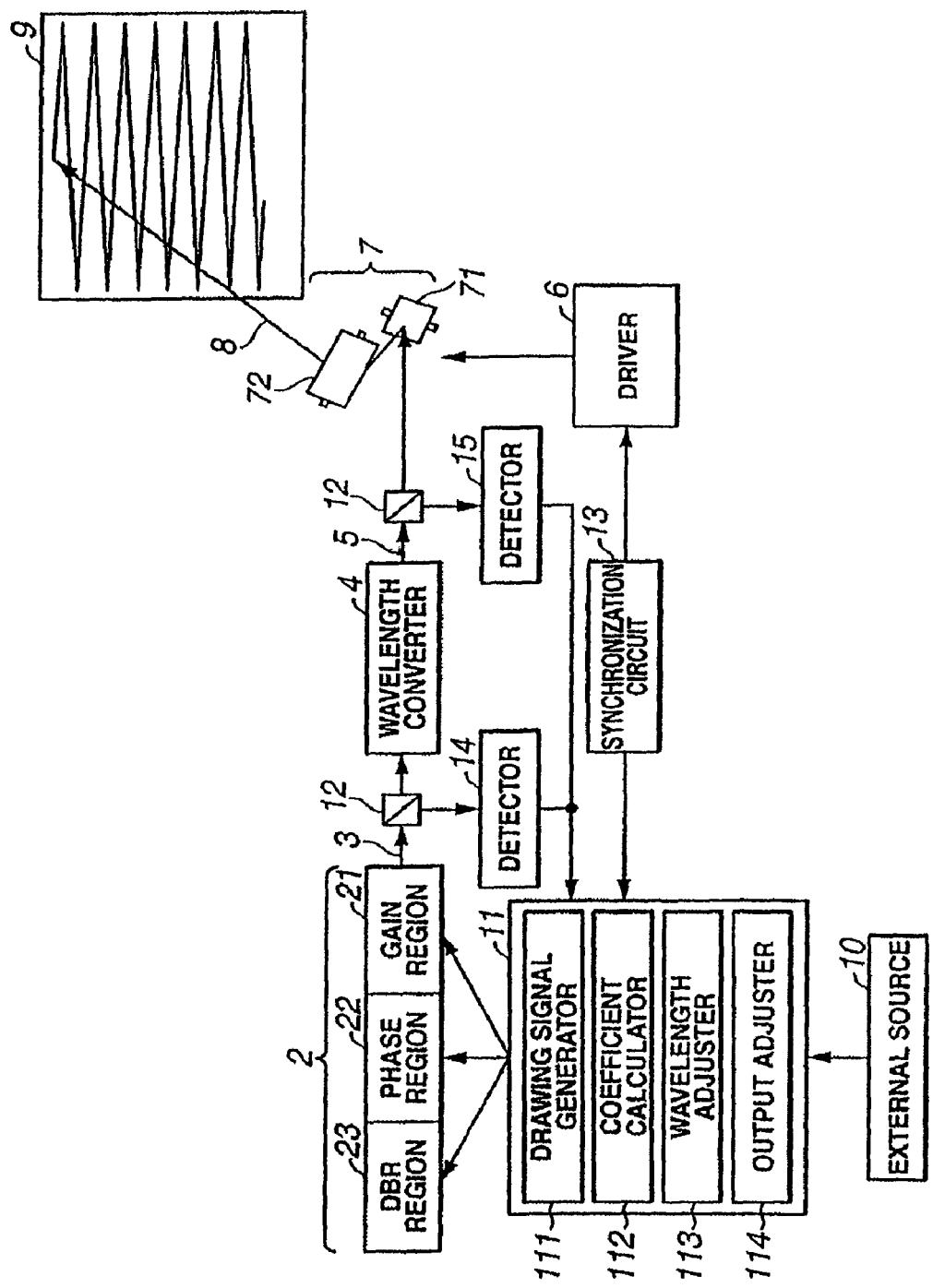
FIG. 9 is a block diagram illustrating the structure of a second embodiment of an image projecting apparatus according to the present invention.

A description will be given for a second embodiment of an image projecting apparatus with reference to FIGS. 9, 10, 11A and 11B. FIG. 9 illustrates the structure of the second embodiment. In FIG. 9, the same portions or elements as those in FIG. 2 are designated by the same reference numerals.

Figure 10:
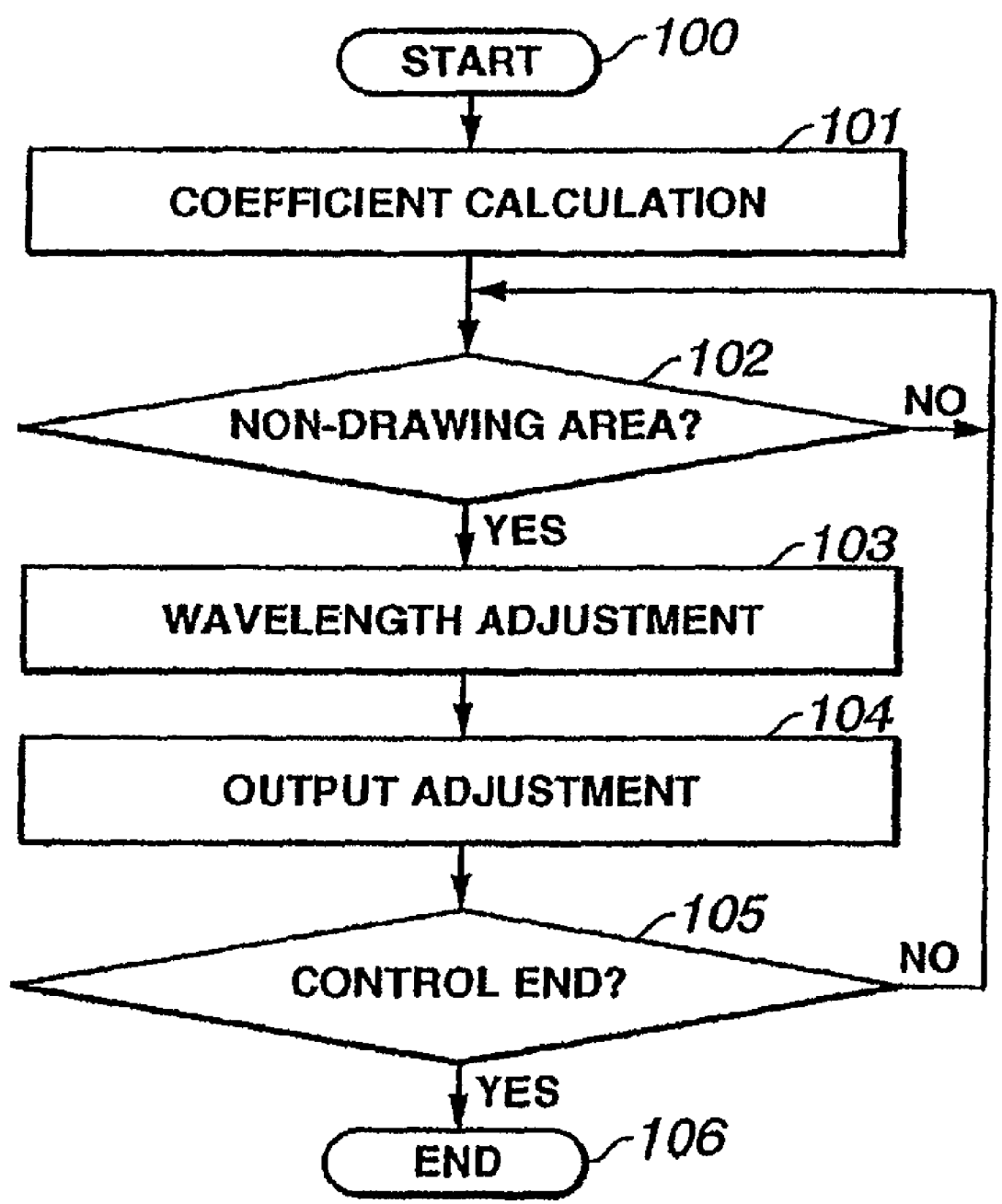
FIG. 10 is a control flow chart of the second embodiment.

FIG. 10 shows a control flow of the second embodiment. In the second embodiment, following a coefficient calculation step 101 and a non-drawing area decision step 102, a wavelength adjuster 113 executes a wavelength adjustment step 103 in the non-drawing time, and an output adjuster 114 executes an output adjustment step 104 of adjusting the second harmonic wave light 5 at a desired value.

Figure 11A:
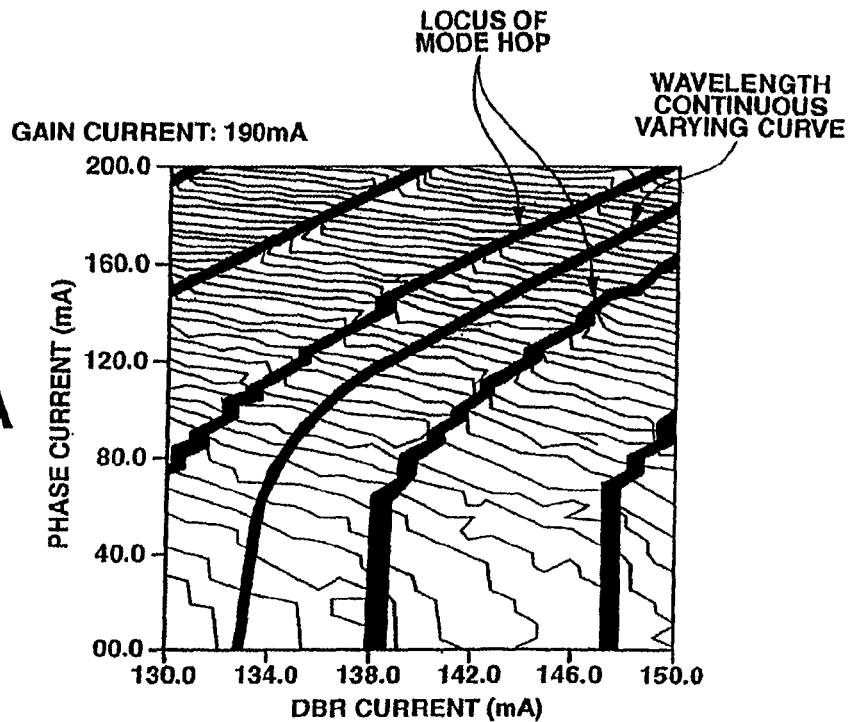
FIGS. 11A and 11B are graphs showing relationships between a DBR current, a phase current and an oscillation wavelength of a semiconductor laser at a time when a gain current is changed in the second embodiment.
Figure 11B:
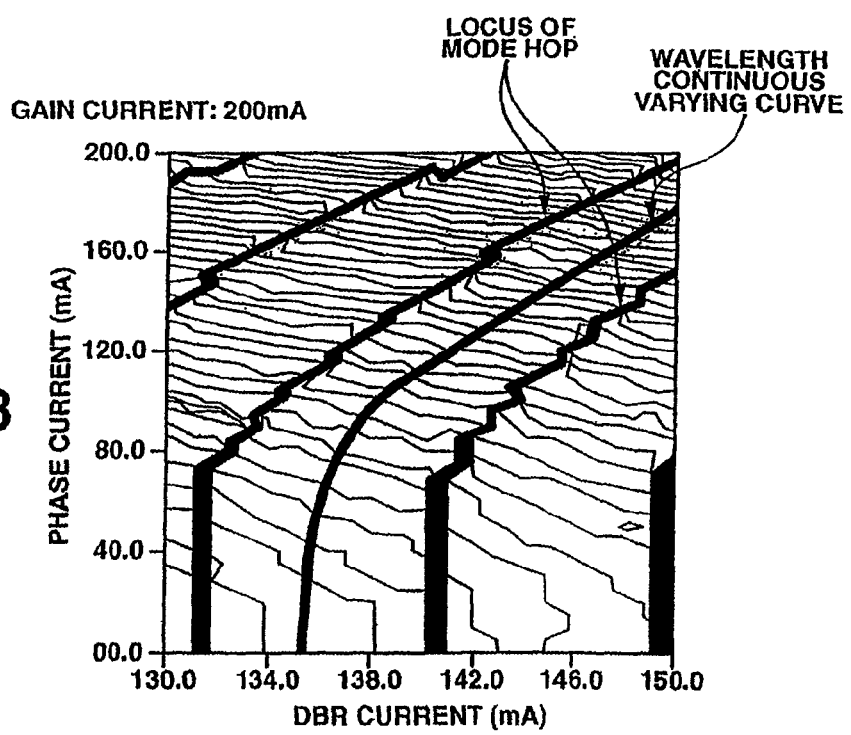

The output adjustment step 104 will now be discussed. After the wavelength adjustment step 103, the second harmonic wave light 5 is not always at a desired value. Accordingly, in the output adjustment step 104, a current injected into the active region 21 of the DFB semiconductor laser 2 is changed such that the second harmonic wave light 5 reaches a desired value. When the active current injected into the active region 21 is changed, the DBR current and the phase current causing the mode hop vary as illustrated in FIGS. 11A and 11B.

Therefore, when the coefficients A and B and the constant C of the wavelength continuous varying curve are adjusted pursuant to the current injected into the gain region 21, it becomes possible to continuously change the oscillation wavelength of the semiconductor laser 2 without occurrence of any mode hop. Although all of the coefficients A and B and the constant C can be altered pursuant to the change in the active current injected into the gain region 21, the coefficients A and B can be assumed to remain unchanged since the slope of the wavelength continuous varying curve remains almost unchanged as illustrated in FIGS. 11A and 11B.

Here, only the constant C is changed pursuant to the active current injected into the active region 21. A new constant C' can be calculated by $$C' = C + D \cdot \Delta I_{gain} \qquad (2)$$

where $\Delta I_{gain}$ is the amount of the change in the active current injected into the active region 21, and D is the correcting coefficient of the active current. The correcting coefficient D can be obtained by measurement performed beforehand, or can be calculated by detecting a point of the mode hop while changing the active current in the non-drawing time.

According to the second embodiment, the second harmonic wave light 5 in the drawing area can be stabilized at a desired value, and the wavelength continuous varying curve can be corrected pursuant to the change in the active current injected into the active region 21 such that the second harmonic wave light 5 can be stabilized without occurrence of any mode hop subsequent to the control of the active current. With respect to other points, the second embodiment is the same as the first embodiment.

Figure 12:
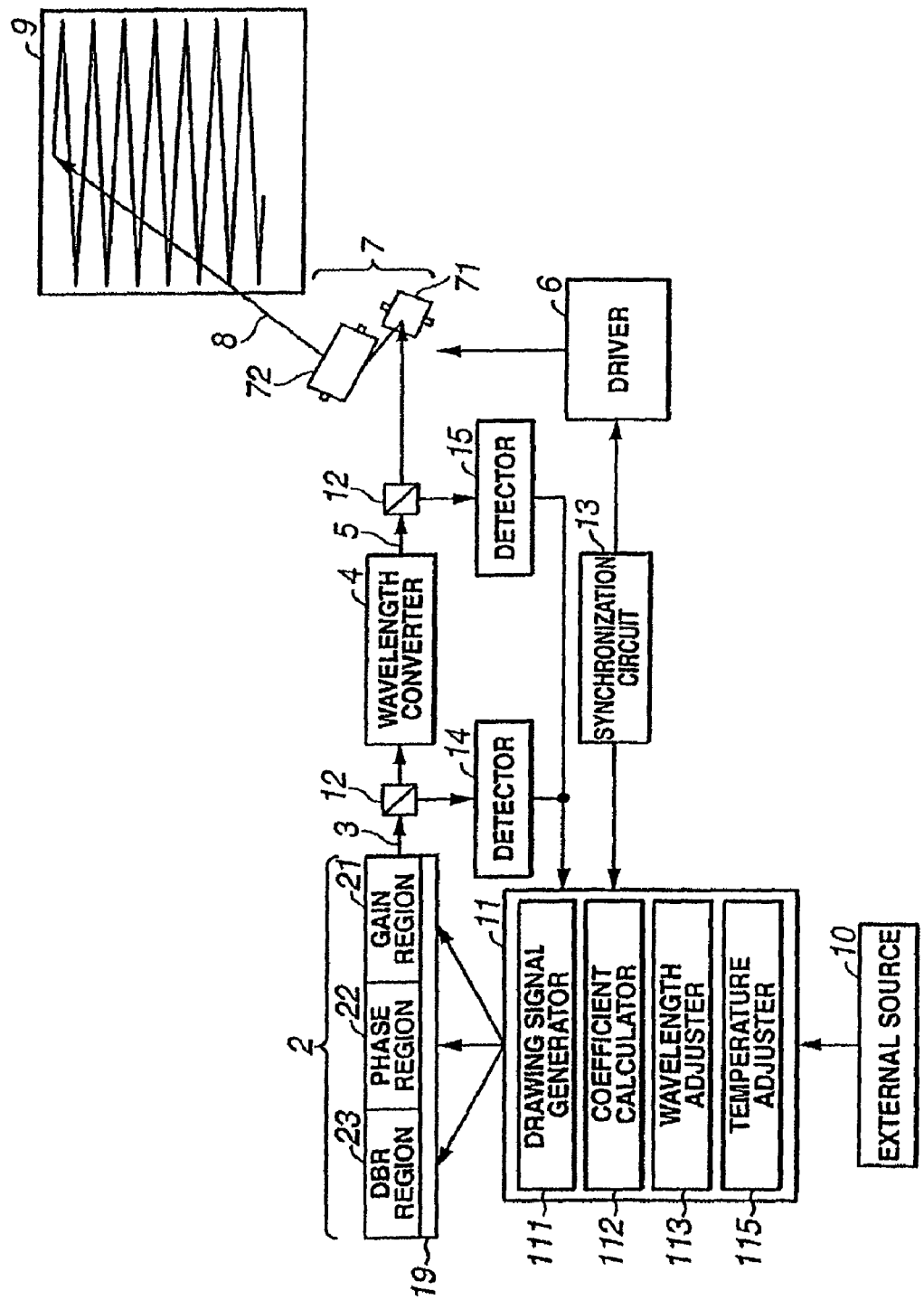
FIG. 12 is a block diagram illustrating the structure of a third embodiment of an image projecting apparatus according to the present invention.

A description will now be given for a third embodiment of an image projecting apparatus with reference to FIGS. 12, 13, 14A and 14B. FIG. 12 illustrates the structure of the third embodiment. In FIG. 12, the same portions or elements as those in FIG. 2 are designated by the same reference numerals.

Figure 13:
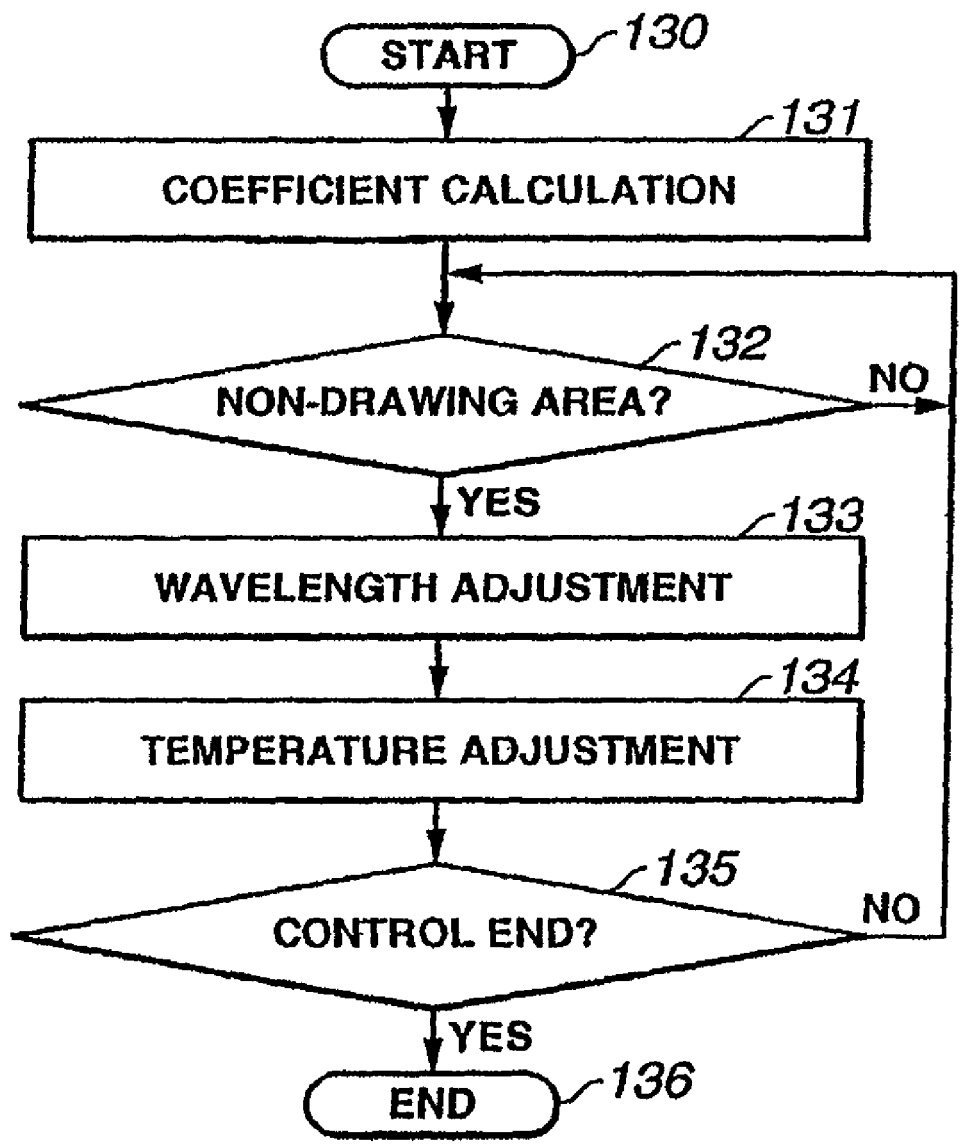
FIG. 13 is a control flow chart of the third embodiment.

FIG. 13 shows a control flow of the third embodiment. In the third embodiment, a temperature monitor 19 monitors temperature of the DFB semiconductor laser 2. In a coefficient calculation step 131, at least one coefficient in a relationship between currents injected into the DBR region 23 and the phase region 22 is corrected in accordance with temperature information from the temperature monitor 19 in the non-drawing time. This is followed by a non-drawing area decision step 132, a wavelength adjustment step 133, and a temperature adjustment step 134.

Figure 14A:
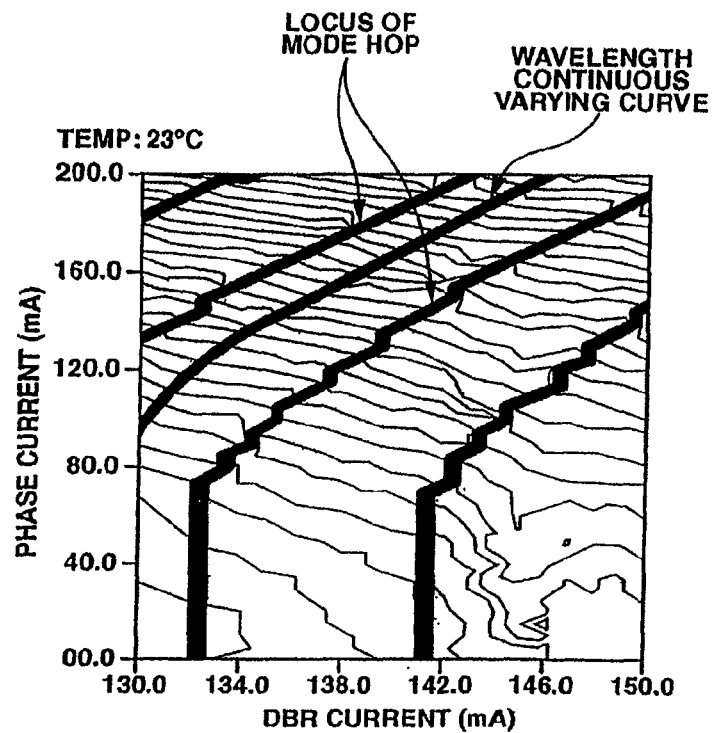
FIGS. 14A and 14B are graphs showing relationships between a DBR current, a phase current and an oscillation wavelength of a semiconductor laser at a time when a gain current is changed in the third embodiment.
Figure 14B:
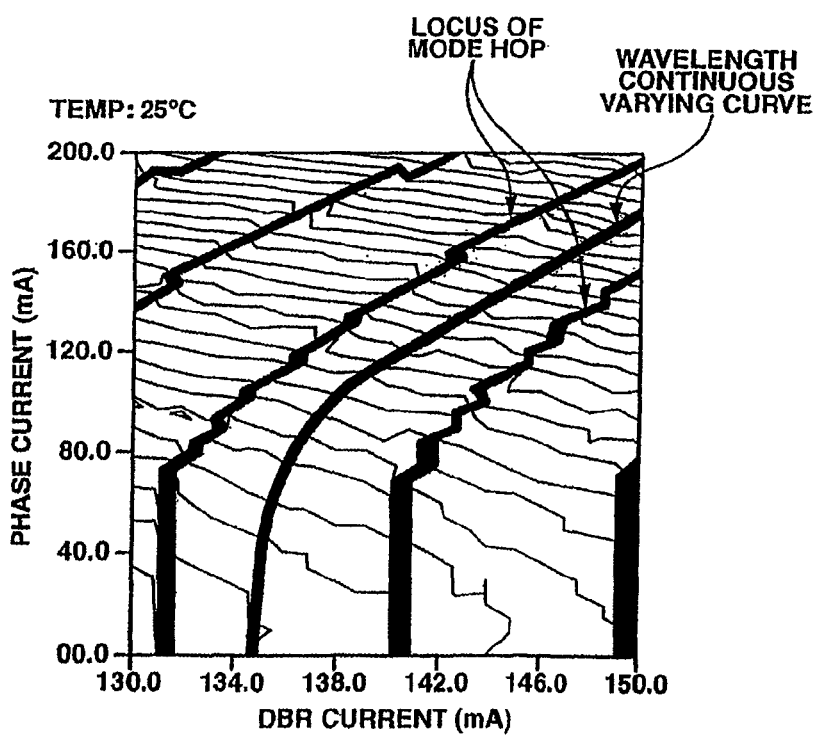

The temperature adjustment step 134 will now be discussed. Temperature of the DFB semiconductor laser 2 changes due to an atmospheric temperature of the image projecting apparatus 1 used. When the temperature of the DFB semiconductor laser 2 is changed, the DBR current and the phase current, which cause the mode hop, vary as illustrated in FIGS. 14A and 14B.

Therefore, when the coefficients A and B and the constant C of the wavelength continuous varying curve are adjusted pursuant to the change in the temperature of the DFB semiconductor laser 2, it becomes possible to continuously change the oscillation wavelength of the semiconductor laser 2 without occurrence of any mode hop. Although all of the coefficients A and B and the constant C can be altered pursuant to the change in the temperature of the DFB semiconductor laser 2, the coefficients A and B can be assumed to remain unchanged since the slope of the wavelength continuous varying curve remains almost unchanged as illustrated in FIGS. 14A and 14B.

Here, only the constant C is changed pursuant to the change in the temperature of the DFB semiconductor laser 2. A new constant C" can be calculated by $$C'' = C + E \cdot \Delta T \qquad (3)$$

where $\Delta T$ is the amount of the change in the temperature of the DFB semiconductor laser 2, and E is the correcting coefficient of the temperature. The correcting coefficient E can be obtained by measurement performed beforehand, or can be calculated by detecting a point of the mode hop while changing the temperature of the DFB semiconductor laser 2 in the non-drawing time.

According to the third embodiment, the wavelength continuous varying curve can be corrected pursuant to the change in the temperature of the DFB semiconductor laser 2 such that the second harmonic wave light 5 can be stabilized without occurrence of any mode hop due to the change in the atmospheric temperature. With respect to other points, the third embodiment is similar to the first embodiment.

A description will now be given for a fourth embodiment of an image projecting apparatus with reference to FIG. 15. The structure of the fourth embodiment is similar to the first embodiment illustrated in FIG. 2.

In the fourth embodiment, currents injected into the phase region 22 and the DBR region 23 of the DFB semiconductor laser 2 change the refractive index of the semiconductor layer, and varies the wavelength of the fundamental-wave light 3. The DFB semiconductor laser 2 capable of changing its oscillation wavelength by injection of carriers has a feature that the oscillation wavelength can be controlled at high speed.

Figure 15:
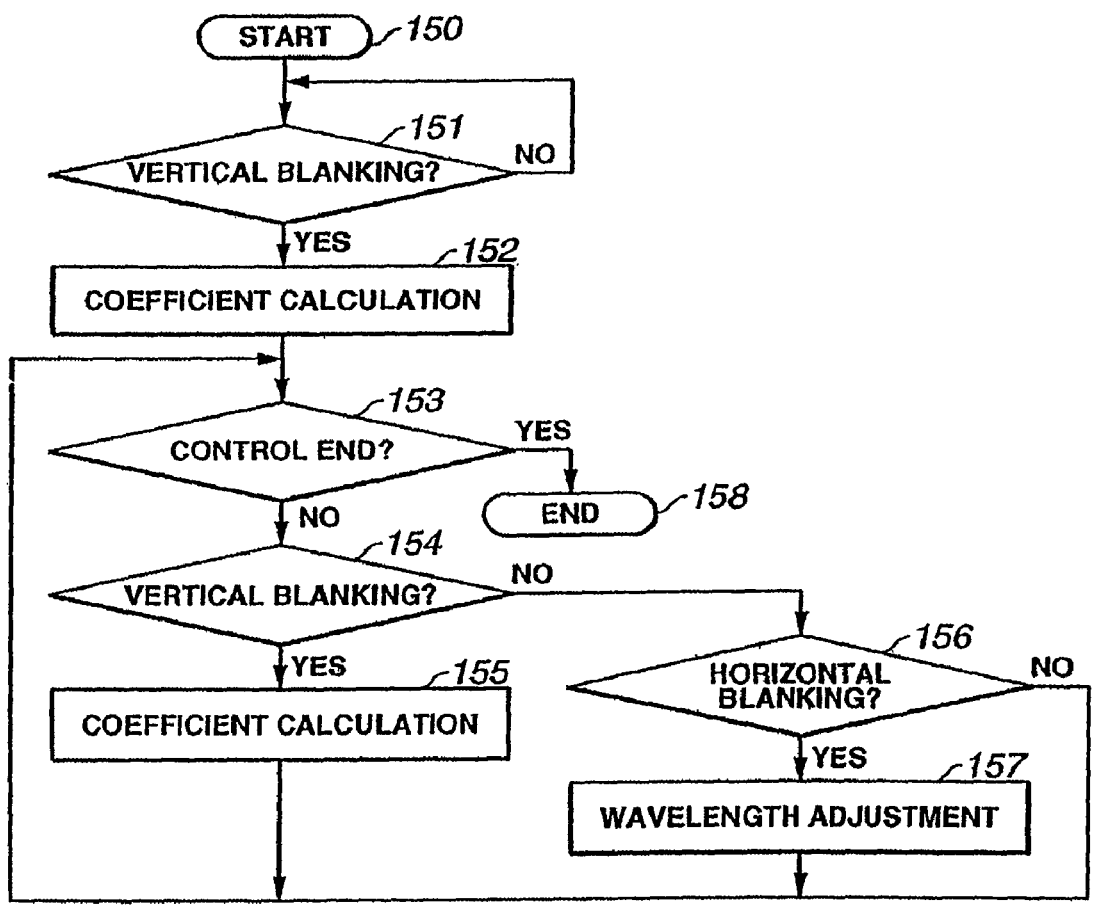
FIG. 15 is a control flow chart of a fourth embodiment of an image projecting apparatus according to the present invention.

FIG. 15 shows a control flow of the fourth embodiment. In the fourth embodiment, a coefficient calculator 112 carries out a coefficient calculation step 152 (or 155) in the vertical blanking time 17 of an image projecting apparatus, based on a vertical blanking decision step 151 (or 154). Further, a wavelength adjuster 113 carries out a wavelength adjustment step 157 in the horizontal blanking time 18 of the image projecting apparatus, based on a horizontal blanking decision step 156.

In the DFB semiconductor laser 2 capable of changing the wavelength by the injection of carriers, a change in the refractive index of the semiconductor is approximately proportional to the density of carriers. Since the density of carriers is approximately proportional to the amount of injected current, a wavelength continuous varying curve can be approximated by $$A_1 \cdot I_{DBR} + B_1 \cdot I_{phase} = C \qquad (4)$$

where $I_{DBR}$ is the DBR current, $I_{phase}$ is the phase current, $A_1$ and $B_1$ are proportional coefficients, respectively, and C is a constant.

By addition of the term of the square (second power) or more power of current to the formula (4), the relationship of the formula (4) can reflect a change in the temperature due to the current injection and saturation of a change in the refractive index by the current injection. Further, the determination of the wavelength continuous varying curve is not limited to the above discussion. It can also be carried out by fitting to an appropriate function from discretely-detected points, for example.

According to the fourth embodiment, because the coefficient calculation step 152 (or 155) and the wavelength adjustment step 157 are performed in the vertical blanking time 17 and the horizontal blanking time 18, respectively, in the DFB semiconductor laser 2 capable of speedily controlling the oscillation wavelength by the injection of carriers, the output or the efficiency of the second harmonic wave 5 in the drawing time can be stabilized at its peak. As for other points, the fourth embodiment is similar to the first embodiment.

The present invention can also be applied to an optical apparatus, such as an image forming apparatus, in which drawing light is one-dimensionally deflected. In such an image forming apparatus, laser light (for example, in a green-color wavelength range) emitted from a light wavelength converting device undergoes predetermined intensity modulation performed corresponding to a timing of optical scanning, and is one-dimensionally scanned by an optical scanning system. The scanned laser light forms an image on a rotating photosensitive member through a writing lens.

The photosensitive member is uniformly charged by a charging device, and an electrostatic latent image is formed on a portion of the photosensitive member scanned with the light. A toner image is formed on an image portion of the electrostatic latent image by a developing device. Upon transfer and fixation of the toner image, for example, on a sheet, an image is formed on the sheet. According to the present invention, an image with improved quality can be formed.

While the present invention has been described with respect to what is presently considered to be the preferred embodiments and examples, it is to be understood that the invention is not limited to the disclosed embodiments and examples. The present invention is intended to cover various modifications and equivalent arrangements included within the spirit and the scope of the appended claims.

This application claims priority from Japanese Patent Application No. 2004-142955, filed May 12, 2004, and No. 2005-055237, filed Mar. 1, 2005, the contents of which are hereby incorporated by reference.

What is claimed is:

1. A control method of controlling a distributed Bragg reflection (DBR) semiconductor laser having a DBR region, a phase region and an active region comprising the steps of:

obtaining a formula representing a curve positioned approximately at the center between a locus of a first mode hop and a locus of a second mode hop, the loci being indicated on a graph showing a relationship among a DBR current injected into the DBR region, a phase current injected into the phase region and an oscillation wavelength of the DBR semiconductor laser; and adjusting the oscillation wavelength of the DBR semiconductor laser by changing the DBR current and the phase current such that a formula is satisfied, wherein the formula is represented by $A \cdot I_{DBR}^2 + B \cdot I_{phase}^2 = C$, where $I_{DBR}$ is the DBR current, $I_{phase}$ is the phase current, A and B are coefficients, and C is a constant.

2. A control method according to claim 1, wherein the DBR semiconductor laser has a detector for monitoring the amount of the fundamental wave light emitted from the DBR semiconductor laser and the detector detects the DBR current and the phase current at which a mode hop occurs to obtain the coefficients A and B, and the constant C.

3. A control method according to claim 1, further comprising correcting at least one of the coefficient A, the coefficient B and the constant C of the formula obtained in the obtaining step in accordance with a current injected into the active region of the DBR semiconductor laser.

4. A control method according to claim 1, wherein the DBR semiconductor laser has a temperature monitor for monitoring temperature of the DBR semiconductor laser, and the method further comprising correcting at least one of the coefficient A, the coefficient B and the constant C of the formula obtained in the obtaining step in accordance with the temperature detected by the temperature monitor.

* * * * *